(12) United States Patent
Jakobsson

(10) Patent No.: US 6,559,731 B2
(45) Date of Patent: May 6, 2003

(54) VCXO TEMPERATURE COMPENSATION CIRCUIT

(75) Inventor: Peter Jakobsson, Lund (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/801,039

(22) Filed: Mar. 6, 2001

(65) Prior Publication Data
US 2001/0022539 A1 Sep. 20, 2001

(30) Foreign Application Priority Data
Mar. 17, 2000 (GB) .............................. 0006597

(51) Int. Cl.$^7$ ................................ H03B 5/32
(52) U.S. Cl. ................... 331/176; 331/158; 331/116 R; 331/66
(58) Field of Search ................. 331/176, 158, 331/66, 116 R (56) References Cited

U.S. PATENT DOCUMENTS

| | | | |
|---|---|---|---|
| 4,893,097 A | 1/1990 | Zwack | 331/176 |
| 4,922,212 A | 5/1990 | Roberts et al. | 331/176 |
| 5,172,075 A | 12/1992 | Yerbury et al. | 331/14 |
| 5,654,718 A | 8/1997 | Beason et al. | 342/357 |
| 5,874,864 A | 2/1999 | Muto et al. | 331/66 |
| 5,892,408 A | 4/1999 | Binder | 331/44 |
| 5,912,595 A | 6/1999 | Ma et al. | 331/117 |

FOREIGN PATENT DOCUMENTS

| | | |
|---|---|---|
| EP | 0 483 090 A1 | 4/1992 |
| EP | 0 727 876 A1 | 8/1996 |
| GB | 2 132 042 A | 6/1984 |
| JP | 08288741 | 11/1996 |
| JP | 11284435 A | 10/1999 |
| WO | WO 90/16113 | 12/1990 |

OTHER PUBLICATIONS

International Search Report as completed by Antonio Farieta of the ISA/EP on Jun. 29, 2001, in connection with European Patent Application No. PCT/EP01/02868.
Search Report as performed on Jun. 21, 2000, by UK Patent Office Examiner D. Midgley as pertaining to Patent Application No. GB 0006597.9.
Search Report as conducted by World Patent Technology WPT AB on Oct. 19, 1999.

*Primary Examiner*—Arnold Kinkead
(74) *Attorney, Agent, or Firm*—Jenkens & Gilchrist, P.C.

(57) ABSTRACT

A voltage controlled crystal oscillator (VCXO), for example, as used in a mobile communications terminal, has its output frequency $F_{ref}$ stabilised against temperature drift using frequency correction information received, for example, in a downlink signal from a base station. A controller uses the frequency correction information to produce a digital value which is supplied to a DAC which controls the output frequency of the VCXO. While the frequency is being stabilised in this manner, compensation values are determined based on the DAC value and temperature values from a temperature ADC, and stored in memory. When the correction information ceases to be available, the compensation values from the memory are used to compensate for temperature fluctuations. Each compensation value corresponds to a linear temperature region, and relates to the gradient for that temperature region. In this way, the invention does not need to store a vast number of compensation values, and does not require complex interpolation techniques for determining the control value for the VCXO's DAC.

22 Claims, 8 Drawing Sheets

VCXO TEMPERATURE COMPENSATION CIRCUIT

FIELD OF THE INVENTION

The invention relates to temperature compensation of a voltage controlled crystal oscillator (VCXO), and in particular, to a method and apparatus for adaptive temperature compensation of a VCXO used in a mobile communications terminal.

BACKGROUND OF THE INVENTION

The reference frequency in a mobile station is generated with the aid of a crystal. The crystal is needed in order to fulfil frequency stability and accuracy requirements, as imposed by telecommunication standards such as GSM.

Unfortunately, the stability and accuracy of the frequency is temperature dependent.

While this can be a disadvantage, it does not pose any problems while the mobile station is in communication with a base station, since it can control the reference frequency using frequency correction information transmitted in the downlink signal from the base station.

However, in a GSM system, during temporary loss of the signal received from the base station, the mobile station must still be required to maintain its reference frequency to an accuracy of 0.2 ppm during a period of 64 slow associated control channel (SACCH) blocks.

Thus, if the temperature changes during the gap in reception, conventional non-temperature compensated crystals will not be able to fulfil the accuracy requirements mentioned above.

The worst case scenario is when the mobile station starts to transmit on the highest output power and then loses its synchronisation with the base station. The temperature change in the mobile station, due to heating of the power amplifier, will raise the temperature of the crystal. This change in crystal temperature will cause the frequency to drift.

Many solutions are known to exist to overcome this problem.

According to one solution, an average temperature dependency curve is supplied by the manufacturer of the crystal. The crystals are screened according to how much they deviate from the average temperature curve. Only crystals that fall within acceptable limits from the average temperature curve are thereafter used in manufacture. When the mobile station is in use, it measures the temperature and uses the average temperature dependancy curve to compensate the tuning of the reference frequency in the mobile station.

This solution has many disadvantages. For example, manufacturers have to screen crystals which deviate too much from the average temperature dependancy curve. This results in a low yield, particularly for applications having a large temperature gradient. This problem becomes more relevant as mobile stations become smaller, resulting in greater temperature gradients within the mobile stations. In addition, the size of the crystal also dictates the temperature gradient which, again, also increases as the size of the package reduces.

Figure 1:
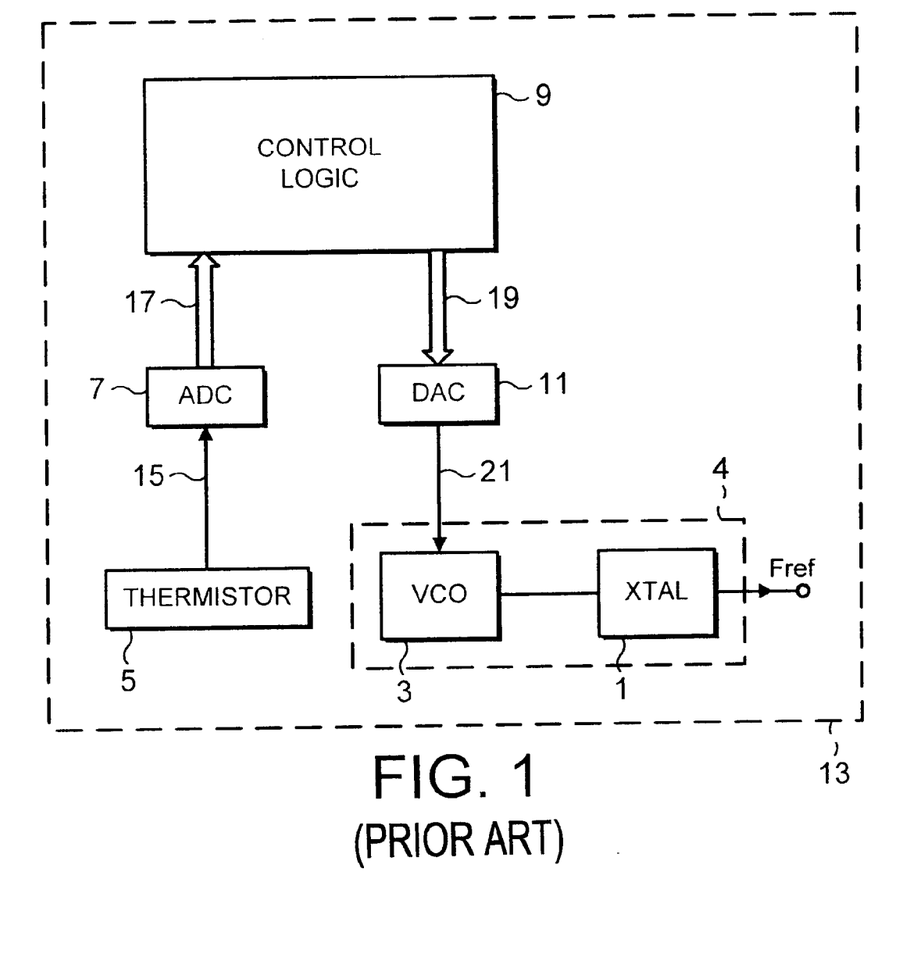
FIG. 1 shows a known temperature compensated crystal oscillator (TCXO)

FIG. 1 shows another commonly known solution in which a crystal 1 is packaged with a reference voltage controlled oscillator VCO 3, (forming a voltage controlled crystal oscillator VCXO 4), a thermistor 5, an analogue to digital converter (ADC) 7, control logic 9, and a digital to analogue converter (DAC) 11. This type of module, often called a temperature compensated crystal oscillator (TCXO) 13, is cycled in temperature when it is manufactured. This is done in order to make an individual trimming over the entire working temperature range of the crystal 1.

The thermistor 5 measures the temperature of the crystal 1, and its output signal 15 is converted by the ADC 5 into a digital signal 17 for processing by the control logic 9. Depending on the measured temperature, the control logic 9 outputs a corresponding digital value 19, or compensation value, to the DAC 11 which provides a tuning signal 21 to the VCO 3 to obtain the desired reference frequency $F_{ref}$.

This type of solution suffers from the disadvantage of having to cycle each individual crystal though the entire working temperature range during manufacture, which takes an unreasonable amount of time. In addition, the provision of the thermistor 5, ADC 7, control logic 9 and DAC 11 all add to the overall cost of the crystal 1.

Furthermore, the solution of FIG. 1 must either store a vast number of temperature values and corresponding DAC values (which in turn requires a large memory), or store fewer temperature values, which requires the use of a complex interpolation technique or algorithm to deduce a DAC value from a temperature dependancy curve.

The aim of the present invention is to provide a method and apparatus for adaptive temperature compensation of a voltage controlled crystal oscillator which does not suffer from the disadvantages mentioned above.

SUMMARY OF THE INVENTION

According to a first aspect of the present invention, there is provided a method of controlling the output frequency of a voltage controlled crystal oscillator (VCXO) which is controlled by a VCXO control signal, the method comprising the steps of:

(a) during a first period, receiving frequency correction information from a first source, and using this frequency correction information to control the output frequency of the VCXO; characterised by the steps of (b) during the first period, determining a plurality of VCXO compensation values which correspond to respective predefined temperature regions, and which are indicative of a linear relationship between the VCXO control signal and temperature in the region concerned;

(c) storing the compensation values; and, (d) during a second period when the frequency correction information from the first source is not available, determining the temperature range in which the VCXO is operating and using the corresponding stored compensation value to determine the VCXO control signal, thereby controlling the output frequency of the According to another aspect of the invention, there is provided an apparatus for controlling the output frequency of a voltage controlled crystal oscillator (VCXO) which is controlled by a VCXO control signal, the apparatus comprising:

(a) means for receiving frequency correction information from a first source during a first period;

(b) means for using the frequency control information to control the output frequency of the VCXO during the first period; characterised in that the apparatus further comprises:

(c) means for determining a plurality of VCXO compensation values during the first period, each VCXO compensation value corresponding to a respective predefined temperature region, and indicative of a linear relationship between the VCXO control signal and temperature in the region concerned;

(d) a first memory for storing the compensation values; and, (e) means for determining the temperature range in which the VCXO is operating, and using the corresponding stored compensation value to determine the VCXO control signal for controlling the output frequency of the VCXO during a second period when the frequency correction information is not available.

According to yet another aspect of the present invention, there is provided a mobile communications terminal comprising;

a voltage controlled crystal oscillator, VCXO (25);

a digital to analogue converter, VCXO-DAC, (29) for controlling the VCXO (25) according to a VCXO control signal (39);

means (37) for receiving frequency correction information from a base station (33);

temperature measuring means (43);

an analogue to digital converter (45) for converting the temperature signals into digital signals;

control means (31) for controlling the output frequency of the VCXO 25; wherein the control means comprises:

means for using the received frequency control information to control the output frequency of the VCXO during a first period; characterised in that the mobile communications terminal further comprises:

means for determining a plurality of VCXO compensation values during the first period, each VCXO compensation value corresponding to a respective predefined temperature region, and indicative of a linear relationship between the VCXO control signal and temperature in the region concerned;

a first memory (41) for storing the compensation values; and, means for determining the temperature range in which the VCXO is operating, and using the corresponding stored compensation value to determine the VCXO control signal for controlling the output frequency of the VCXO during a second period when the frequency correction information is not available.

DETAILED DESCRIPTION OF A PREFERRED EMBODIMENT OF THE INVENTION

Figure 2:
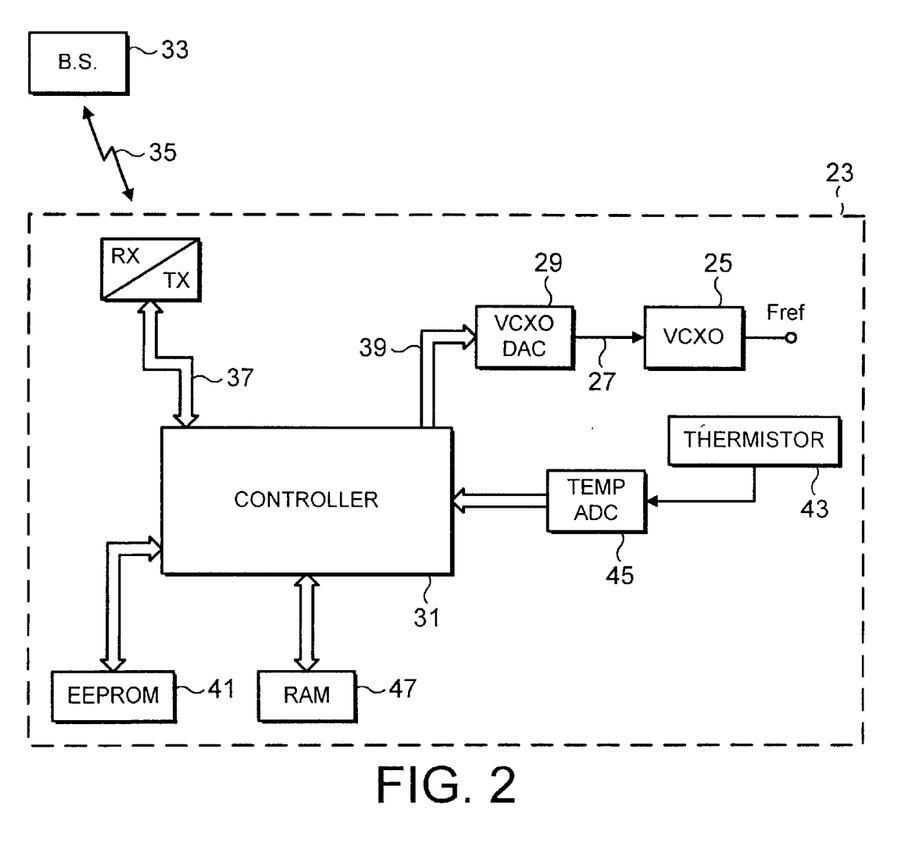
FIG. 2 shows an adaptive temperature compensated voltage controlled crystal oscillator according to a preferred embodiment of the present invention.

FIG. 2 shows a mobile station 23, which comprises a voltage controlled crystal oscillator (VCXO) 25 for producing an output frequency $F_{ref}$, being the reference frequency of the mobile station 23. The output frequency $F_{ref}$ of the VCXO 25 is controlled according to the analogue voltage 27 supplied by a digital to analogue converter, referred to as the VCXO-DAC 29. The VCXO-DAC 29 is controlled by a controller 31.

When the mobile station 23 is in communication with a base station 33, frequency correction information contained in the downlink signal 35 is received by the transceiver 37, and passed to the controller 31. The controller 31 controls the VCXO-DAC 29 by outputting a digital value, referred to as the VCXO-DAC value 39, to the VCXO-DAC 29. The digital value is chosen according to the frequency correction information contained in the downlink signal 35. The analogue signal 27 from the VCXO-DAC 29 is then used for tuning the VCXO 25, to obtain the desired reference frequency $F_{ref}$.

Thus, when the mobile station 23 is in communication with the base station 33, the reference frequency $F_{ref}$ of the mobile station 23 is not affected by any temperature changes, since it is maintained stable and accurate according to the frequency correction information received from the base station 33.

While in this mode of operation, the mobile station 23 adaptively calculates a set of temperature compensation values, referred to as $EEPROM_{DELTAVALUES}$, which are stored in an EEPROM 41. Each $EEPROM_{DELTAVALUE}$ represents a linear region on a temperature dependancy curve. The stored $EEPROM_{DELTAVALUES}$ are subsequently used for controlling the reference frequency $F_{ref}$, if the link to the base station 33 becomes interrupted, resulting in the frequency correction information no longer being available.

A temperature measurement device, for example a thermistor 43, is provided for measuring the temperature in the vicinity of the VCXO 25. These temperature measurements are passed via a temperature ADC 45 to the controller 31. The controller 31 uses the temperature ADC values, firstly, when initially calculating the $EEPROM_{DELTAVALUES}$ (i.e. when the frequency correction information is being received from the base station 33), and secondly, when the $EEPROM_{DELTAVALUES}$ are subsequently used to control the reference frequency during an interruption in the link to the base station 33.

The time interval between temperature measurements depends upon the particular application in which the invention is being used, that is, the temperature variations in the working environment. The time interval will therefore vary from one application to another, but will preferably be regular for a particular application.

According to the preferred embodiment of the invention, the temperature ADC 45 is eight bits wide, and can therefore be used to represent 31 linear regions on the temperature dependancy curve, each region being 8 ADC values wide. In other words, the linear regions represent temperature ADC values 0–7, 8–15, 16–23, 24–31, 32–39, 40–47 . . . 240–247 and 248–255.

Figure 3:
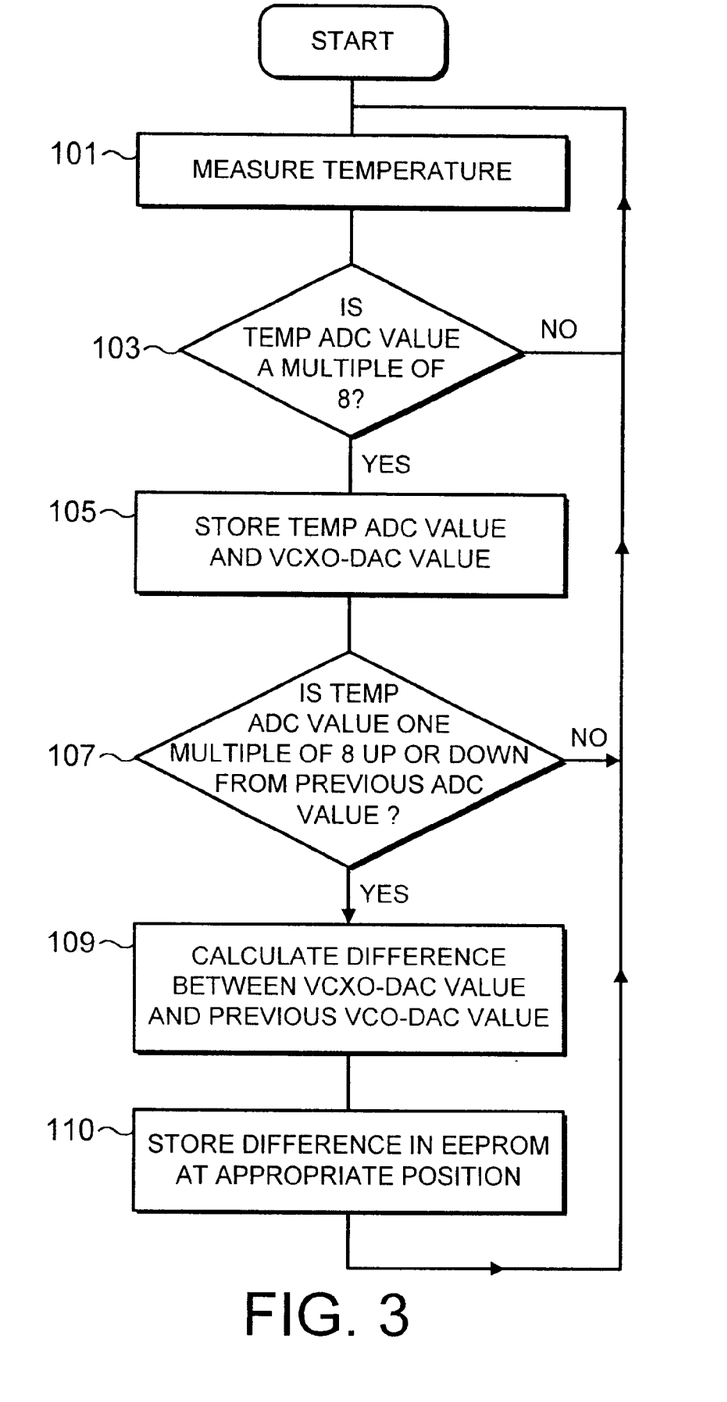
FIG. 3 shows the method of determining compensation values while external frequency correction information is available.

FIG. 3 shows the steps involved in determining the temperature compensation values, that is the $EEPROM_{DELTAVALUES}$, which are stored in the EEPROM, while the frequency correction information is available from the base station.

After each temperature measurement, step 101, the controller 31 determines whether the temperature ADC value is a multiple of eight (that is 0, 8, 16, 24, 32 . . . 248), step 103.

If the output of the temperature ADC is not a multiple of eight, the controller 31 does nothing and awaits the result of the next temperature measurement.

If the output of the temperature ADC is a multiple of eight, the temperature ADC value is temporarily stored in RAM 47, together with the present VCXO-DAC value 39, step 105. The controller 31 also maintains a record of one old data record of each of these values so that the present and previous records are accessible. Incidentally, the previous records will be initially set to zero when the mobile station is used for the first time.

The controller 31 determines whether the difference between the new and old temperature ADC value is one multiple (8-bits) up or down, step 107. This check is carried out to determine whether the new value represents a point at the other end of a neighbouring linear region, in which case, the controller 31 will want to calculate the $EEPROM_{DELTAVALUE}$, or gradient, for that linear region (represented by the difference between the VCXO-DAC values 39 for the new and old points).

It is noted that during initial use of the invention a special case will occur in which the first value is not stored until two "multiple of eight" points have been crossed.

If the difference between the new and old temperature ADC values is one multiple (8-bits) up or down, the controller calculates the difference in VCXO-DAC value 39 between the present and previous VCXO-DAC values 39 stored in RAM, step 109. This difference provides an indication of the linear gradient of the VCXO-DAC values 39 for that particular region on the temperature dependancy curve, and is stored as an $EEPROM_{DELTAVALUE}$, step 110. Each $EEPROM_{DELTAVALUE}$ is stored in the EEPROM at a specific position "n", "n+1", "n+2" . . . "n+30", according to which linear temperature region it relates to on the temperature dependancy curve.

It is noted that the difference is preferably calculated as "high temperature ADC-value" VCXO data subtracted by the "low temperature ADC-value" VCXO data. However, the opposite may be used provided that consistency is maintained throughout.

Therefore, as the temperature varies during use, the EEPROM will gradually store an $EEPROM_{DELTAVALUE}$ for each region. As mentioned above, in this particular example, up to a maximum of 31 $EEPROM_{DELTAVALUES}$ are stored, each one relating to a linear region 0–7, 8–15, 16–23, 24–31, 32–39, 40–47 . . . 240–247 or 248–255, respectively.

The $EEPROM_{DELTAVALUES}$ are used for controlling the reference frequency $F_{ref}$ when the frequency correction information is no longer available from the base station, as will be discussed in greater detail later.

Figure 4:
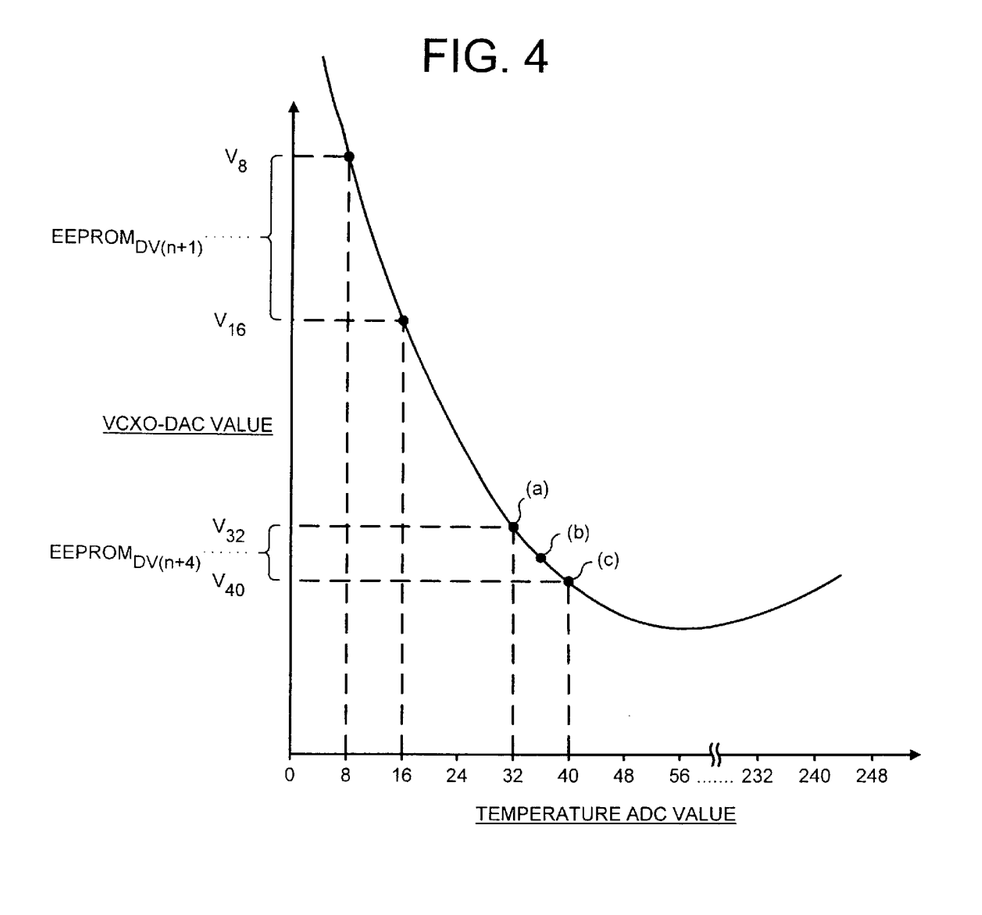
FIG. 4 is a graph which further explains the method of FIG. 3.

The method of storing $EEPROM_{DELTAVALUES}$ will now be explained in further detail with reference to FIG. 4.

Assume that the previously stored data values in RAM (i.e. the previous temperature ADC value and previous VCXO-DAC value) correspond to that of point (a). This corresponds to a temperature ADC value of 32 and a corresponding VCXO-DAC value $V_{32}$.

If the next temperature measurement takes place at point (b), the temperature ADC value is somewhere between 32 and 40, and is thus not a multiple of 8. Therefore, no action is taken in response to this temperature measurement.

If the next temperature measurement is taken at point (c), the temperature ADC value is 40, which is a multiple of 8. Therefore, the controller will store the current temperature ADC value (i.e. 40) and the current VCXO-DAC value (i.e. $V_{40}$) in RAM.

Next, the controller checks whether the current temperature ADC value (40) is one multiple (i.e. 8-bits) up or down from the previous value. In this case, the results is "YES", since the previous temperature ADC value was 32.

This indicates to the controller that points (a) and (c) represent opposite ends of a linear region and, therefore, a value representing the gradient of this linear region should be stored as a $EEPROM_{DELTAVALUES}$.

Thus, the controller calculates the difference between the two VCXO-DAC values (i.e. the difference between $V_{40}$ and $V_{32}$—corresponding to the temperature ADC values 40 and 32 respectively).

As mentioned above, this difference value represents the $EEPROM_{DELTAVALUES}$, and indicates the gradient between points (a) and (c). The region between points (a) and (c) corresponds to the $5^{th}$ region, which means that the $EEPROM_{DELTAVALUE}$ for this region is stored in the EEPROM at position n+4, (position "n" being used for storing the $EEPROM_{DELTAVALUE}$ for temperature ADC value 0, position n+1 for storing the $EEPROM_{DELTAVALUE}$ for ADC value 8, position n+2 for storing the $EEPROM_{DELTAVALUE}$ for ADC value 16, etc.).

When the link to the base station ceases to be available, and the frequency correction signal is no longer available, the controller uses the stored $EEPROM_{DELTAVALUES}$ for controlling the reference frequency $F_{ref}$, as will hereinafter be explained.

Figure 5:
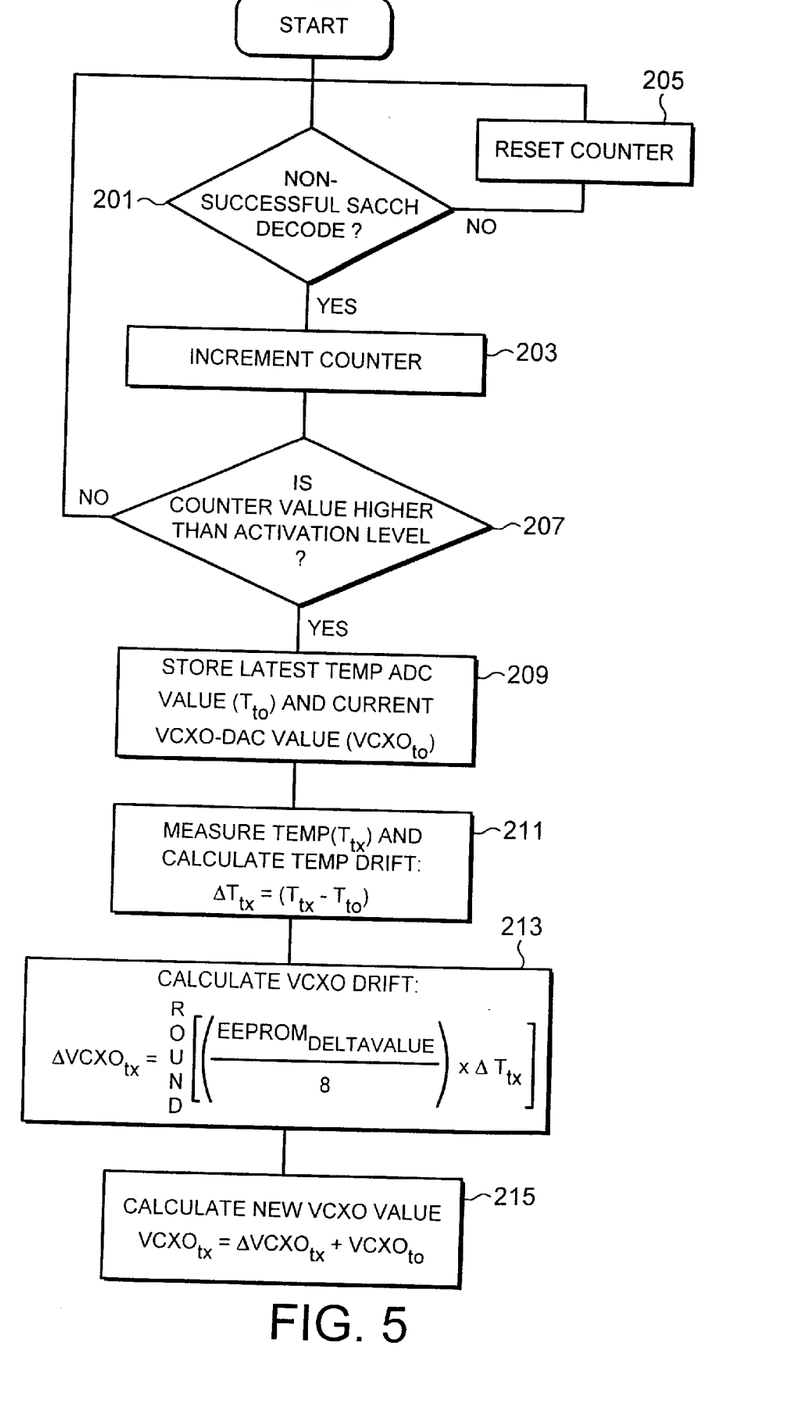
FIG. 5 shows the method of using the compensation values to compensate for temperature when the external frequency correction information is not available.

With reference to FIG. 5, the first stage involves determining when the mobile station should switch from using the frequency control information received from the base station, to using the $EEPROM_{DELTAVALUES}$ stored in the EEPROM.

Preferably, the system includes an in-built delay before it switches from one mode to another. The controller determines in step 210 whether a non-successful decoding of a SACCH burst has occurred (which indicates that no frequency correction information is available from the base station). If a non-successful decode has occurred, a counter, preferably an eight bit counter, is incremented by one, step 203 (starting from zero). The counter is reset to zero, step 205, after every successfully demodulation of a SACCH burst.

After each increment of the counter, the controller checks if the accumulated value is higher than an "activation delay parameter", step 207, which will have been pre-stored in the EEPROM, (for example, at byte location 32).

If the counter level is lower than the activation level, the controller returns to step 201 and awaits the result of the next SACCH decode operation.

When the counter value is higher than the activation delay parameter, the current VCXO-DAC value ($VCXO_{to}$) and latest temperature ADC value ($T_{to}$) are stored in RAM, step 209.

The system has now changed its mode of operation, so that the $EEPROM_{DELTAVALUES}$ will hereinafter be used to determine the VCXO-DAC values 39 supplied to the VCXO-DAC 29, as long as the counter value is above the activation level.

While in this mode, the temperature drift $\Delta T_{tx}$ is calculated each time the present temperature $T_{tx}$ is measured, step 211:

$$\Delta T_{tx}(T_{tx}-T_{to})$$

Next, the temperature drift $\Delta T_{tx}$ is converted into a corresponding VCXO drift $\Delta VCXO_{tx}$, by multiplying with the $EEPROM_{DELTAVALUE}$ corresponding to the temperature at temperature $T_{to}$, step 213. The $EEPROM_{DELTAVALUE}$ may be selected from the EEPROM, for example, using the five most significant bits of the Temp ADC value to point to the correct "n" value.

Thus, $$\Delta VCXO_{tx}=\text{Round}((EEPROM_{DELTAVALUE}/8)*\Delta T_{tx})$$

The present VCXO-DAC value $VCXO_{tx}$ can then be calculated by adding the calculated VCXO drift $\Delta VCXO_{tx}$ to the VCXO value previously stored in RAM, $VCXO_{to}$, step 215:

$$VCXO_{tx}\cong\Delta VCXO_{tx}+VCXO_{to}$$

The VCXO-DAC value is updated after every temperature measurement until the mobile station has the possibility to switch back to normal frequency correction.

FIGS. 6 to 11 show one example of a crystal temperature dependency curve, showing the VCXO-DAC values as a function of temperature, for 32, 16 and 8 bit sample spaces.

Figure 6:
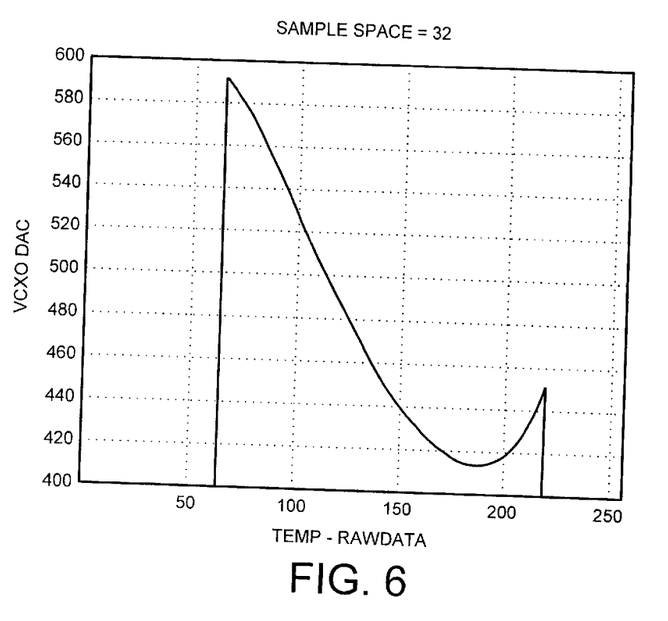
FIGS. 6 and 7 show temperature dependancy curves for a 32-bit sample space.

If the temperature range is broken down into eight segments, this will give a sample space of 32 bits (256/8= 32). FIG. 6 shows a plot of the VCXO-DAC values as a function of the temperature ADC values. The curve is characterised with a sample space of 32 "temp-ADC" values.

Figure 7:
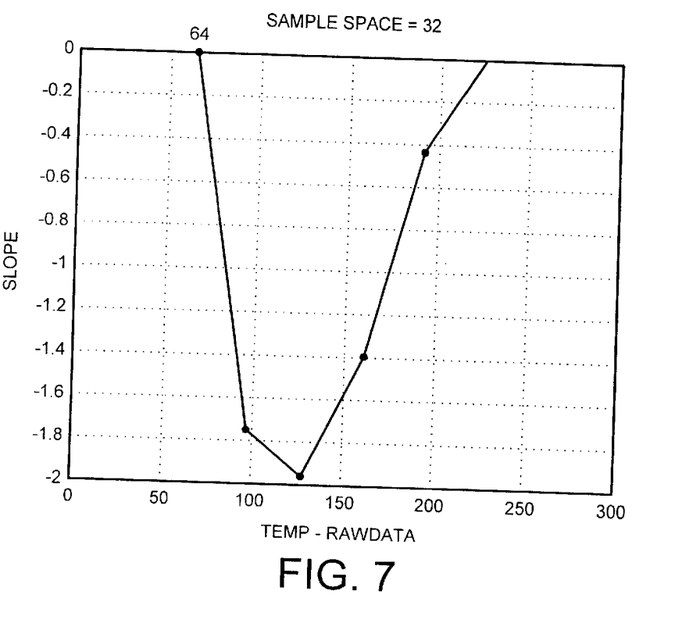

FIG. 7 shows the slope of the curve in FIG. 6 as a function of the temperature ADC value. The curve is characterised with a sample space of 32 "temp-ADC" values.

Figure 8:
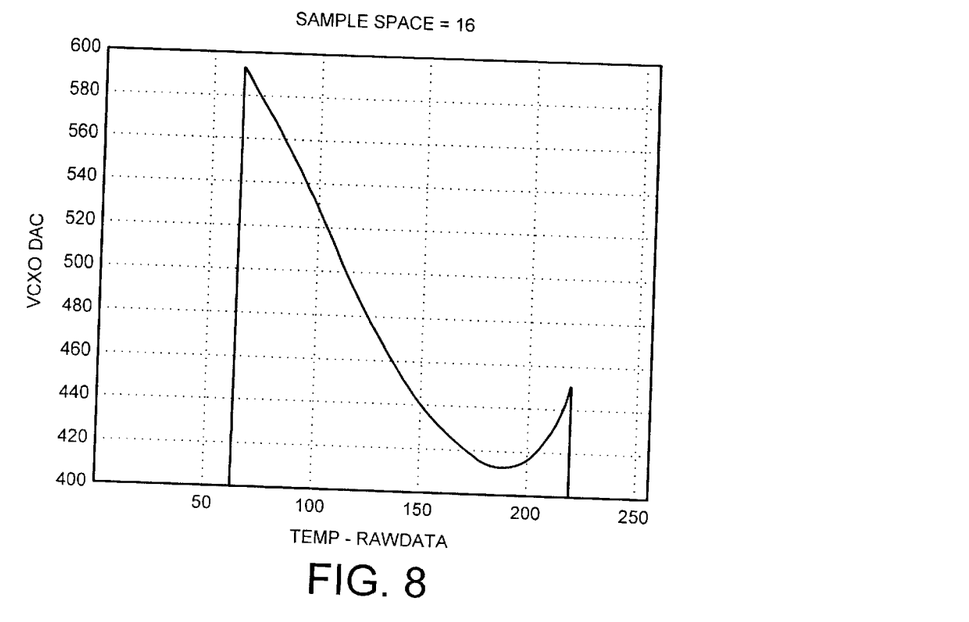
FIGS. 8 and 9 show temperature dependancy curves for a 16-bit sample space.

FIG. 8 shows a plot of the VCXO-DAC values as a function of the temperature ADC values. The curve is characterised with a sample space of 16 "temp-ADC" values.

Figure 9:
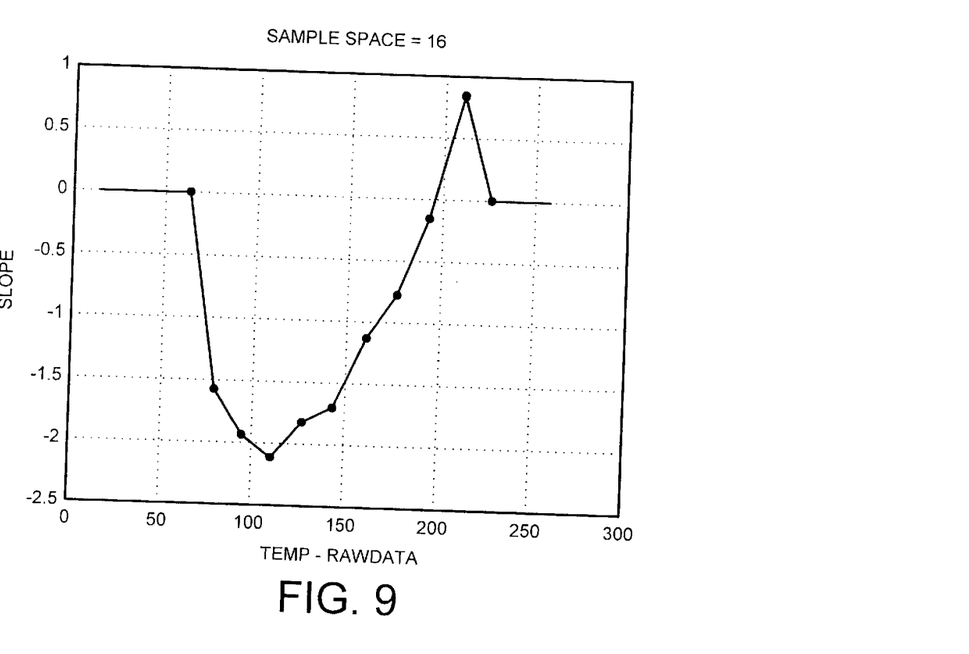

FIG. 9 shows the slope of the curve in FIG. 8 as a function of the temperature ADC value. The curve is characterised with a sample space of 16 "temp-ADC" values.

Figure 10:
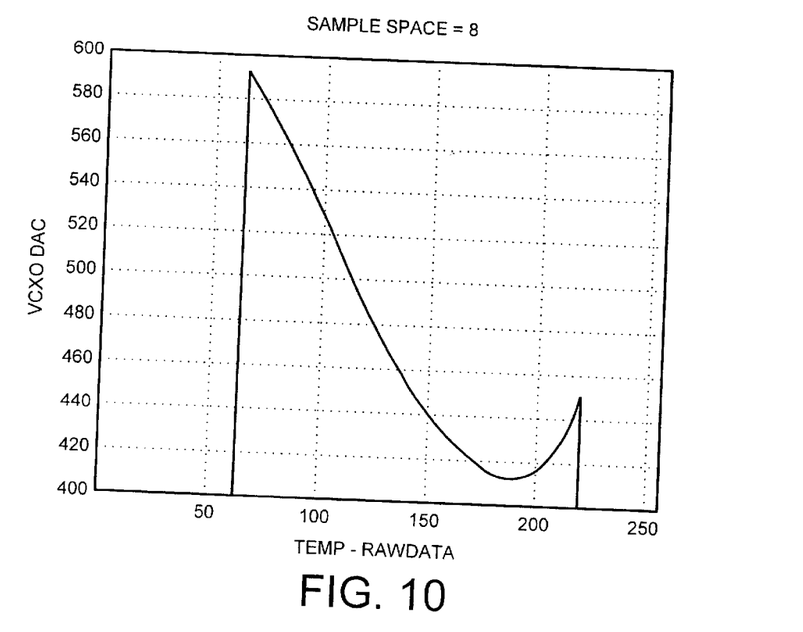
FIGS. 10 and 11 show temperature dependancy curves for a 8-bit sample space.

FIG. 10 shows a plot of the VCXO-DAC as a function of the temperature ADC value. The curve is characterised with a sample space of 8 "temp-ADC" values.

Figure 11:
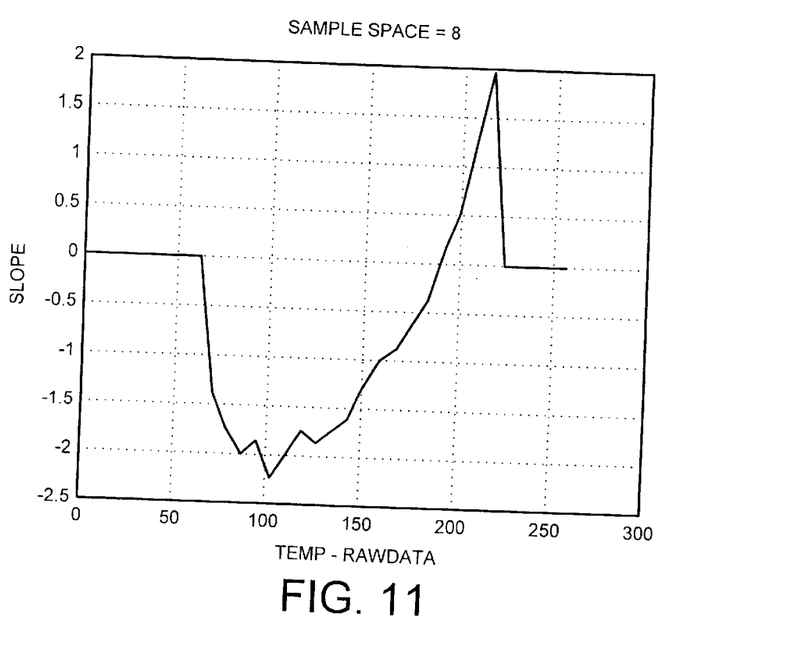

FIG. 11 shows the slope of the curve in FIG. 10 as a function of the temperature ADC value. The curve is characterised with a sample space of 8 "temp-ADC" values.

The temperature slope will vary depending upon the conditions in a particular mobile station, i.e. the physical relationship of the crystal with respect to the thermistor. Normally, this would pose a problem for temperature compensated crystals which are trimmed beforehand, or rely on using predetermined temperature dependancy curves.

However, the present invention does not suffer from this problem, since the adaptive determination of the compensation values in-situ, provides accurate compensation values for that particular environment.

Another important advantage is that the invention will provide accurate compensation during temporary loss of the base station signal, even if the base station has a small frequency error, for example due to a hardware error. This is because only relative mapping is used, without any absolute references to the measured frequency of the connected base station. Thus, the stored values can still be used to provide accurate compensation even if adaptively learnt from an inaccurate base station frequency.

It is noted that the invention uses the principle that, although each crystal will have its own temperature dependancy characteristics, they all have one common feature, which is the fact that the rate of change of frequency with temperature is not very fast, i.e. the temperature dependancy curve is not steep.

The invention is particularly advantageous in that only one parameter needs to be stored for each temperature region, as opposed to storing a plurality of temperature values and corresponding VCXO-DAC values for a large number of temperatures.

In addition, the invention does not rely on the use of any complicated algorithms for interpolating a VCXO-DAC value from an average temperature dependancy curve.

Although the preferred embodiment has been described having specific features, such as 31 linear temperature regions, and an eight bit counter for determining the activation level, it is noted that these are merely the preferred features, and the invention is equally applicable to systems having other values or ranges.

Likewise, although the values are stored in the EEPROM in ascending order, they may alternatively be stored in descending order.

The counter is described as being reset after a successful SACCH burst. Alternatively, the counter could be reset when the decoded SACCH burst is above a predetermined quality. In this way, the invention can make use of signal quality information provided by a mobile station for determining when the counter should be reset. Thus, if signal quality is poor, or the bit error rate (BER) is high, the counter is not reset.

It is also possible for the frequency compensation to be based on something other than a SACCH burst, for example, every received burst. However, this would increase power consumption. It is therefore preferable to base the frequency compensation on the SACCH bursts, since the interval between SACCH bursts is suited to the required update frequency of the VCXO.

It is noted that other such modifications may be made by a person skilled in the art, without departing from the scope of the invention as defined in the appended claims.

What is claimed is:

1. A method of controlling the output frequency of a voltage controlled crystal oscillator (VCXO) which is controlled by a VCXO control signal, the method comprising the steps of:

(a) during a first period, receiving frequency correction information from a first source, and using this frequency correction information to control the output frequency of the VCXO;

(b) during the first period, determining a plurality of VCXO compensation values which correspond to respective predefined temperature regions, and which are indicative of a linear relationship between the VCXO control signal and temperature in the region concerned, the step of determining the compensation values during the first period comprising:

(e) measuring the current temperature;

(f) determining whether the current temperature corresponds to one of a predetermined set of temperature values, the set of temperature values defining the temperature regions; and, if so, (g) storing the current temperature value and a corresponding VCXO control signal;

(h) determining whether the current temperature value is adjacent in the set of temperature values to a temperature value previously stored in step (g), and, if so, (i) determining the difference between the currently stored VCXO control signal and a VCXO control signal previously stored in step (g); and, (j) storing the difference value as the compensation value representing that particular temperature region;

(c) storing the compensation values; and, (d) during a second period when the frequency correction information from the first source is not available, determining the temperature range in which the VCXO is operating and using the corresponding stored compensation value to determine the VCXO control signal, thereby controlling the output frequency of the VCXO.

2. The method as claimed in claim 1, wherein the step of storing each compensation value (j) involves storing the compensation value at a predetermined memory address corresponding to the particular temperature region.

3. The method as claimed in claim 1, wherein the step of using the compensation values in step (d) comprises:

calculating a temperature drift from when the frequency correction information ceased to be available;

using the compensation value for that temperature region to determine a corresponding VCXO control signal drift; and, using the VCXO control signal drift to determine the current VCXO control signal.

4. The method as claimed in claim 1, wherein the step of using the compensation values in step (d) comprises:

storing a temperature value ($T_{to}$) and VCXO control signal $VCXO_{to}$ corresponding to when the frequency correction information ceased to be available;

measuring the present temperature value $T_{tx}$;

determining a temperature drift, $\Delta T_{tx}$, as $$\Delta T_{tx} = (T_{tx} - T_{to});$$

determining a corresponding VCXO control signal drift, $\Delta VCXO_{tx}$, as $$\Delta VCXO_{tx} = \text{Round}((EEPROM_{DELTAVALUE}/8) * \Delta T_{tx}]$$

determining the current VCXO control signal, $VCXO_{tx}$ as $$VCXO_{tx} = \Delta VCXO_{tx} + VCXO_{to}; \text{ and}$$

using the current VCXO control signal, $VCXO_{tx}$, to control the output frequency of the VCXO.

5. The method as claimed in claim 1, having a delay between when the frequency correction information ceases to be available, to when the compensation values are used for determining the VCXO control signal.

6. The method as claimed in claim 5, wherein the delay comprises:

determining whether a SACCH burst has been unsuccessfully received, and, if so, incrementing a counter;

determining whether the counter value is higher than a preset value, and, if so, using the compensation values to determine the VCXO control signal.

7. The method as claimed in claim 6, wherein the counter is reset upon receipt of a successfully decoded SACCH burst.

8. The method as claimed in claim 1, wherein the predefined temperature regions are of equal size.

9. The method as claimed in claim 1, wherein the VCXO control signal represents a digital value supplying a digital to analogue converter (DAC) which controls the output frequency of the VCXO.

10. The method as claimed in claim 1, wherein accurate frequency compensation is provided during the second period even if the frequency of the first source has an error.

11. An apparatus for controlling the output frequency of a voltage controlled crystal oscillator (VCXO) which is controlled by a VCXO control signal, the apparatus comprising:

(a) means for receiving frequency correction information from a first source during a first period;

(b) means for using the frequency control information to control the output frequency of the VCXO during the first period; characterised in that the apparatus further comprises:

(c) means for determining a plurality of VCXO compensation values during the first period, each VCXO compensation value corresponding to a respective predefined temperature region, and indicative of a linear relationship between the VCXO control signal and temperature in the region concerned, wherein the means for determining the compensation values comprises:

temperature measuring means for measuring the current temperature;

means for determining whether the current temperature corresponds to one of a predetermined set of temperature values, the set of temperature values defining the temperature regions;

a second memory for storing the current temperature value and a corresponding VCXO control signal if the current temperature value corresponds to one of the predetermined set of temperature values;

means for determining whether the current temperature value is adjacent in the set of temperature values to an old temperature value previously stored in the second memory;

means for determining the difference between the current VCXO control signal and an old VCXO control signal previously stored in the second memory, if the current temperature value is adjacent to the previous temperature value; and, means for storing in the first memory the difference value representing the compensation value for that particular temperature region;

(d) a first memory for storing the compensation values; and, (e) means for determining the temperature range in which the VCXO is operating, and using the corresponding stored compensation value to determine the VCXO control signal for controlling the output frequency of the VCXO during a second period when the frequency correction information is not available.

12. The apparatus as claimed in claim 11, wherein the first memory means comprises predefined memory locations, each one of the predefined memory locations storing a compensation value corresponding to a particular temperature region.

13. The apparatus as claimed in claim 11, wherein the means for using the compensation values when the frequency correction information is not available comprises:

means for calculating a temperature drift from the time the frequency correction information ceased to be available;

means for using the compensation value for that temperature region to determine a corresponding VCXO control signal drift; and, means for using the VCXO control signal drift to determine the current VCXO control signal.

14. The apparatus as claimed in claim 11, wherein the means for using the compensation values when the frequency correction information is not available comprises:

means for storing the temperature value ($T_{to}$) and a VCXO control signal $VCXO_{to}$ corresponding to when the frequency correction information ceased to be available;

means for measuring the present temperature $T_{tx}$, and calculating a temperature drift $\Delta T_{tx}$ as $$\Delta T_{tx}=(T_{tx}-T_{to});$$

means for calculating a corresponding VCXO control signal drift, $\Delta VCXO_{tx}$, as:

$$\Delta VCXO_{tx}=\text{Round}((EEPROM_{DELTAVALUE}/8)*\Delta t_{tx};$$

means for determining the current VCXO control signal, $\Delta VCXO_{tx}$, as:

$$\Delta VCXO_{tx}=\Delta VCXO_{tx}+\Delta VCXO_{to}; \text{ and}$$

means for controlling the output frequency of the VCXO according to the current VCXO control value $VCXO_{tx}$.

15. The apparatus as claimed in claim 11, further comprising delay means for delaying the using of the compensation values for determining the VCXO control signal after the frequency correction information ceases to be available.

16. The apparatus as claimed in claim 15, wherein the delay means comprises:

a counter;

means for determining whether a SACCH burst has been unsuccessfully received, and, if so, incrementing the counter;

means for determining whether the counter value is higher than a preset value, and, if so, using the compensation values for determining the VCXO control signal while the counter value is above the preset value.

17. The apparatus as claimed in claim 16, having means for resetting the counter upon receipt of a successfully decoded SACCH burst.

18. The apparatus as claimed in claim 11, having a digital to analogue converter (DAC) for controlling the VCXO, whereby the DAC is controlled by the VCXO control signal.

19. The apparatus as claimed in claim 11, wherein the first memory means is an EEPROM.

20. The apparatus as claimed in claim 19, wherein the memory addresses in the EEPROM store compensation values corresponding to temperature regions of equal size.

21. The apparatus as claimed in claim 11, wherein accurate frequency compensation is achieved during the second period even if the frequency of the first source has an error.

22. A mobile communications terminal comprising the apparatus as claimed in claim 11.

* * * * *

UNITED STATES PATENT AND TRADEMARK OFFICE
CERTIFICATE OF CORRECTION

PATENT NO. : 6,559,731 B2  Page 1 of 1
DATED : May 6, 2003
INVENTOR(S) : Peter Jakobsson It is certified that error appears in the above-identified patent and that said Letters Patent is hereby corrected as shown below:

Column 2,
Line 53, replace "frequency of the" with -- frequency of the VCXO. --

Column 6,
Line 14, replace "EEPROM$_{DELTAVALUES}$." with -- EEPROM$_{DELTAVALUE}$. --
Line 20, replace "EEPROM$_{DELTAVALUES}$," with -- EEPROM$_{DELTAVALUE}$, --

Column 7,
Line 5, replace "$_\Delta T_{tx} (T_{tx} - T_{to})$" with -- $_\Delta T_{tx} = (T_{tx} - T_{to})$ --

Column 9,
Line 40, replace "$\Delta T_{tx}1$" with -- $\Delta T_{tx})$; --

Signed and Sealed this

Twenty-fifth Day of November, 2003

JAMES E. ROGAN
*Director of the United States Patent and Trademark Office*